(12) United States Patent
Komada

(10) Patent No.: US 7,612,362 B2
(45) Date of Patent: Nov. 3, 2009

(54) NITRIDE SEMICONDUCTOR LIGHT EMITTING DEVICE

(75) Inventor: Satoshi Komada, Mihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 46 days.

(21) Appl. No.: 11/941,453

(22) Filed: Nov. 16, 2007

(65) Prior Publication Data

US 2008/0116477 A1 May 22, 2008

(30) Foreign Application Priority Data

Nov. 22, 2006 (JP) .............................. 2006-315298
Dec. 4, 2006 (JP) .............................. 2006-327124

(51) Int. Cl.
*H01L 31/00* (2006.01)

(52) U.S. Cl. .......................... 257/13; 257/94; 257/103; 257/E29.315

(58) Field of Classification Search ................... 257/13, 257/76, 78, 79–103, 918, E29.315
See application file for complete search history.

(56) References Cited

U.S. PATENT DOCUMENTS

| | | | |
|---|---|---|---|
| 6,724,013 | B2 | 4/2004 | Kneissl et al. |
| 6,847,057 | B1 | 1/2005 | Gardner et al. |
| 7,078,256 | B2 | 7/2006 | Ryu et al. |
| 2002/0175341 | A1 | 11/2002 | Biwa et al. |
| 2004/0183063 | A1* | 9/2004 | Nakamura et al. ............ 257/14 |
| 2008/0118999 | A1 | 5/2008 | Komada |

FOREIGN PATENT DOCUMENTS

JP 2002-319703 10/2002

OTHER PUBLICATIONS

Machine Translation of JP 2002-319703 A, Oct. 31, 2002, obtained from http://www.ipdl.inpit.go.jp/homepg_e.ipdl.*
U.S. Office Action, mailed Sep. 4, 2008, directed to related U.S. Appl. No. 12/073,215; 8 pages.
U.S. Office Action mailed Feb. 20, 2009 directed towards related U.S. Appl. No. 12/073,215; 9 pages.
U.S. Office Action mailed Feb. 23, 2009 directed towards related U.S. Appl. No. 11/941,442; 9 pages.

* cited by examiner

*Primary Examiner*—Evan Pert
*Assistant Examiner*—Scott R Wilson
(74) *Attorney, Agent, or Firm*—Morrison & Foerster LLP

(57) ABSTRACT

A nitride semiconductor light emitting device includes a substrate, and a first n-type nitride semiconductor layer, a light emitting layer, a first p-type nitride semiconductor layer, a second p-type nitride semiconductor layer, a p-type nitride semiconductor tunnel junction layer, an n-type nitride semiconductor tunnel junction layer and a second n-type nitride semiconductor layer that are formed on the substrate. The p-type nitride semiconductor tunnel junction layer and the n-type nitride semiconductor tunnel junction layer form a tunnel junction, and the p-type nitride semiconductor tunnel junction layer has an indium content ratio higher than that of the second p-type nitride semiconductor layer. At least one of the p-type nitride semiconductor tunnel junction layer and the n-type nitride semiconductor tunnel junction layer includes aluminum.

18 Claims, 5 Drawing Sheets

NITRIDE SEMICONDUCTOR LIGHT EMITTING DEVICE

This nonprovisional application is based on Japanese Patent Applications Nos. 2006-315298 and 2006-327124 filed with the Japan Patent Office on Nov. 22, 2006 and Dec. 4, 2006, respectively, the entire contents of which are hereby incorporated by reference.

BACKGROUND OF THE INVENTION

1. Field of the Invention

The present invention relates to a nitride semiconductor light emitting device, and particularly to a nitride semiconductor light emitting device having a tunnel junction.

2. Description of the Background Art

Regarding a nitride semiconductor light emitting diode device having its side of a p-type nitride semiconductor layer that is a light extraction side, it has conventionally been required that a p-side electrode formed on the p-type nitride semiconductor layer satisfies the following three conditions.

A first condition is that the p-side electrode has a high transmittance for the light emitted from the nitride semiconductor light-emitting diode device. A second condition is that the p-side electrode has a resistance and a thickness that allow injected electric current to be diffused sufficiently within a plane of a light-emitting layer. A third condition is that the p-side electrode has a low contact resistance with respect to the p-type nitride semiconductor layer.

In the case where the side of the p-type nitride semiconductor layer of the nitride semiconductor light emitting diode device is the light extraction side, the p-side electrode formed on the p-type nitride semiconductor layer is conventionally a semi-transparent metal electrode that is formed as a film of a metal such as palladium or nickel having a thickness of approximately a few nm to 10 nm and formed on the entire surface of the p-type nitride semiconductor layer. Such a semi-transparent metal electrode, however, has a low transmittance of approximately 50% for the light emitted from the nitride semiconductor light emitting diode device and thus decreases the light extraction efficiency, resulting in the problem that a high-luminance nitride semiconductor light emitting diode device is difficult to obtain.

Accordingly, a high-luminance nitride semiconductor light emitting diode device is manufactured having, instead of the semi-transparent metal electrode formed as a film of a metal such as palladium or nickel, a transparent and electrically conductive film made of ITO (Indium Tin Oxide) and formed on the entire surface of the p-type nitride semiconductor layer so as to improve the light extraction efficiency. Regarding the nitride semiconductor light emitting diode device having such a transparent and electrically conductive film formed therein, the issue of the contact resistance between the transparent and electrically conductive film and the p-type nitride semiconductor layer is improved by heat treatment or the like.

Patent Document 1 (Japanese Patent Laying-Open No. 2002-319703) discloses a nitride semiconductor light emitting diode device having a group III nitride semiconductor multilayer structure formed on a substrate, and the multilayer structure has at least a first n-type group III nitride semiconductor multilayer structure, a p-type group III nitride semiconductor multilayer structure and a second n-type group III nitride semiconductor layered structure. An n-type group III nitride semiconductor layer in the first n-type group III nitride semiconductor multilayer structure is provided with a negative electrode, an n-type group III nitride semiconductor layer in the second n-type group III nitride semiconductor multilayer structure is provided with a positive electrode, and a tunnel junction is formed by the n-type group III nitride semiconductor layer in the second n-type group III nitride semiconductor multilayer structure and a p-type group III nitride semiconductor layer in the p-type group III nitride semiconductor multilayer structure.

In the nitride semiconductor light emitting diode device disclosed in Patent document 1, the positive electrode is formed at the n-type group III nitride semiconductor layer in the second n-type group III nitride semiconductor multilayer structure, and the n-type group III nitride semiconductor has a carrier density that can be easily increased as compared with the p-type group III nitride semiconductor. Therefore, the contact resistance can be reduced as compared with the conventional structure having its positive electrode formed at the p-type group III nitride semiconductor layer, the driving voltage is lower and larger output drive can be achieved. Further, since the heat generation of the positive electrode that is one of factors of a failure of the nitride semiconductor light emitting diode device is reduced, the diode device is regarded to be able to have improved reliability.

SUMMARY OF THE INVENTION

The transparent and electrically conductive film made of ITO, however, has a problem that optical properties irreversibly change at a high temperature, resulting in a decreased transmittance for visible light. Further, in the case where the transparent and electrically conductive film made of ITO is used, there is a problem that the temperature range of the process after the transparent and electrically conductive film made of ITO is formed is limited because of the purpose of preventing transmittance for visible light from decreasing. In addition, there is the problem that the transparent and electrically conductive film made of ITO is deteriorated due to operation with a large current density and accordingly blackened.

Regarding the nitride semiconductor light emitting diode device disclosed in examples of Patent Document 1, a p-type InGaN layer and an n-type InGaN layer having the In (indium) content ratio approximately equal to that of the light emitting layer form a tunnel junction, and respective film thicknesses are each 50 nm.

As disclosed in examples of Patent Document 1, in order to sufficiently supply In in the form of a solid phase, it is necessary to decrease the growth temperature to approximately 800° C. However, it is difficult to obtain a p-type InGaN layer having a high carrier density of $1 \times 10^{19}/cm^3$ or higher at a low temperature. Therefore, the voltage loss at the tunnel junction cannot be reduced, resulting in the problem that the driving voltage increases.

Further, regarding the nitride semiconductor light emitting diode device disclosed in Patent Document 1, the contact resistance with the positive electrode can be reduced while the reliability due to the voltage loss at the tunnel junction is a problem to be addressed.

For example, in Example 1 of Patent document 1, a nitride semiconductor light emitting diode device is disclosed that has a tunnel junction of a p-type $In_{0.16}Ga_{0.84}N$ layer with a carrier density of $1 \times 10^{19}/cm^3$ and an n-type $In_{0.16}Ga_{0.84}N$ layer having a carrier density of $1 \times 10^{20}/cm^3$. In the case where the nitride semiconductor light emitting diode device thus structured is driven with a large current density, deterioration occurs due to high-density doping impurities and lattice defects or the like of the nitride semiconductor layer of InGaN, which is a cause of deteriorated reliability.

Accordingly, an object of the present invention is to provide a nitride semiconductor light emitting device whose driving voltage can be reduced.

Another object of the invention is to provide a nitride semiconductor light emitting device whose reliability can be improved.

According to a first aspect of the present invention, a nitride semiconductor light emitting device can be provided that includes a substrate, and a first n-type nitride semiconductor layer, a light emitting layer, a first p-type nitride semiconductor layer, a second p-type nitride semiconductor layer, a p-type nitride semiconductor tunnel junction layer, an n-type nitride semiconductor tunnel junction layer and a second n-type nitride semiconductor layer that are formed on the substrate, the p-type nitride semiconductor tunnel junction layer and the n-type nitride semiconductor tunnel junction layer form a tunnel junction, and the p-type nitride semiconductor tunnel junction layer has an indium content ratio higher than an indium content ratio of the second p-type nitride semiconductor layer.

Here, regarding the nitride semiconductor light emitting device in the first aspect of the invention, "indium content ratio" in "the p-type nitride semiconductor tunnel junction layer has an indium content ratio" means the ratio of the number of In atoms to the total number of atoms of Group III elements (Al, Ga and In) included in the p-type nitride semiconductor tunnel junction layer. "Indium content ratio of the second p-type nitride semiconductor layer" means the ratio of the number of In atoms to the total number of atoms of Group III elements (Al, Ga and In) included in the second p-type nitride semiconductor layer. Herein, Al represents aluminum, Ga represents gallium and In represents indium.

Regarding the nitride semiconductor light emitting device in the first aspect of the invention, preferably the second p-type nitride semiconductor layer has a thickness of not less than 2 nm.

Regarding the nitride semiconductor light emitting device in the first aspect of the invention, preferably the second p-type nitride semiconductor layer has its thickness of not less than a critical thickness.

Regarding the nitride semiconductor light emitting device in the first aspect of the invention, preferably the second p-type nitride semiconductor layer is doped with a p-type impurity with a doping density of not less than $1 \times 10^{19}/cm^3$.

Regarding the nitride semiconductor light emitting device in the first aspect of the invention, preferably the p-type nitride semiconductor tunnel junction layer has a thickness of not more than 5 nm.

Regarding the nitride semiconductor light emitting device in the first aspect of the invention, preferably the p-type nitride semiconductor tunnel junction layer is doped with a p-type impurity with a doping density of not less than $1 \times 10^{19}/cm^3$.

Regarding the nitride semiconductor light emitting device in the first aspect of the invention, preferably the first p-type nitride semiconductor layer has its band gap larger than that of the second p-type nitride semiconductor layer, and the second p-type nitride semiconductor layer has its band gap larger than that of the p-type nitride semiconductor tunnel junction layer.

Regarding the nitride semiconductor light emitting device in the first aspect of the invention, preferably the n-type nitride semiconductor tunnel junction layer includes indium.

Regarding the nitride semiconductor light emitting device in the first aspect of the invention, preferably the n-type nitride semiconductor tunnel junction layer is doped with an n-type impurity with a doping density of not less than $1 \times 10^{19}/cm^3$.

Regarding the nitride semiconductor light emitting device in the first aspect of the invention, preferably the n type nitride semiconductor tunnel junction layer has a thickness of not more than 10 nm.

According to a second aspect of the present invention, a nitride semiconductor light emitting device can be provided that includes a substrate, and a first n-type nitride semiconductor layer, a light emitting layer, a p-type nitride semiconductor layer, a p-type nitride semiconductor tunnel junction layer, an n-type nitride semiconductor tunnel junction layer and a second n-type nitride semiconductor layer that are successively formed on the substrate. The p-type nitride semiconductor tunnel junction layer and the n-type nitride semiconductor tunnel junction layer form a tunnel junction, and at least one of the p-type nitride semiconductor tunnel junction layer and the n-type nitride semiconductor tunnel junction layer includes aluminum.

Here, regarding the nitride semiconductor light emitting device in the second aspect of the invention, another layer may be formed in at least a portion selected from the group consisting of a portion between the substrate and the first n-type nitride semiconductor layer, a portion between the first n-type nitride semiconductor layer and the light emitting layer, a portion between the light emitting layer and the p-type nitride semiconductor tunnel junction layer, and a portion between the n-type nitride semiconductor tunnel junction layer and the second n-type nitride semiconductor layer.

Regarding the nitride semiconductor light emitting device in the second aspect of the invention, preferably aluminum content of at least one of the p-type nitride semiconductor tunnel junction layer and the n-type nitride semiconductor tunnel junction layer is not less than 1 atomic % and not more than 5 atomic %.

Regarding the nitride semiconductor light emitting device in the second aspect of the invention, "atomic %" indicating the content of Al refers to, in the case where Al is included in the p-type nitride semiconductor tunnel junction layer and not included in the n-type nitride semiconductor tunnel junction layer, the ratio (%) of the number of Al atoms included relative to the total number of atoms of Group III elements (Al, Ga and In) included in the p-type nitride semiconductor tunnel junction layer. In the case where Al is included in the n-type nitride semiconductor tunnel junction layer and not included in the p-type nitride semiconductor tunnel junction layer, "atomic %" indicating the content of Al refers to the ratio (%) of the number of Al atoms included relative to the total number of atoms of Group III elements (Al, Ga and In) included in the n-type nitride semiconductor tunnel junction layer. In the case where Al is included in both of the p-type nitride semiconductor tunnel junction layer and the n-type nitride semiconductor tunnel junction layer, "atomic %" indicating the content of Al refers to at least one of the ratio (%) of the number of Al atoms included relative to the total number of atoms of Group III elements (Al, Ga and In) included in the p-type nitride semiconductor tunnel junction layer, and the ratio (%) of the number of Al atoms included relative to the total number of atoms of Group III elements (Al, Ga and In) included in the n-type nitride semiconductor tunnel junction layer.

Regarding the nitride semiconductor light emitting device in the second aspect of the invention, preferably the p-type nitride semiconductor tunnel junction layer includes aluminum and indium, and indium content is higher than aluminum content.

Regarding the nitride semiconductor light emitting device in the second aspect of the invention, preferably the n-type nitride semiconductor tunnel junction layer includes aluminum and indium, and indium content is higher than aluminum content.

Regarding the nitride semiconductor light emitting device in the second aspect of the invention, preferably the p-type nitride semiconductor tunnel junction layer is doped with a p-type impurity with a doping density of not less than $1\times10^{19}/cm^3$.

Regarding the nitride semiconductor light emitting device in the second aspect of the invention, preferably the n-type nitride semiconductor tunnel junction layer is doped with an n-type impurity with a doping density of not less than $1\times10^{19}/cm^3$.

Regarding the nitride semiconductor light emitting device in the second aspect of the invention, preferably the n-type nitride semiconductor tunnel junction layer has a thickness of not more than 10 nm.

Regarding the present invention, "doping density of p-type impurity" refers to the density of p-type impurity atoms included in a nitride semiconductor, and "doping density of n-type impurity" refers to the density of n-type impurity atoms included in a nitride semiconductor, and each can be calculated quantitatively by, for example, SIMS (Secondary Ion Mass Spectrometry).

In accordance with the first aspect of the present invention, the nitride semiconductor light emitting device whose driving voltage can be reduced can be provided.

In accordance with the second aspect of the present invention, the nitride semiconductor light emitting device whose reliability can be improved can be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
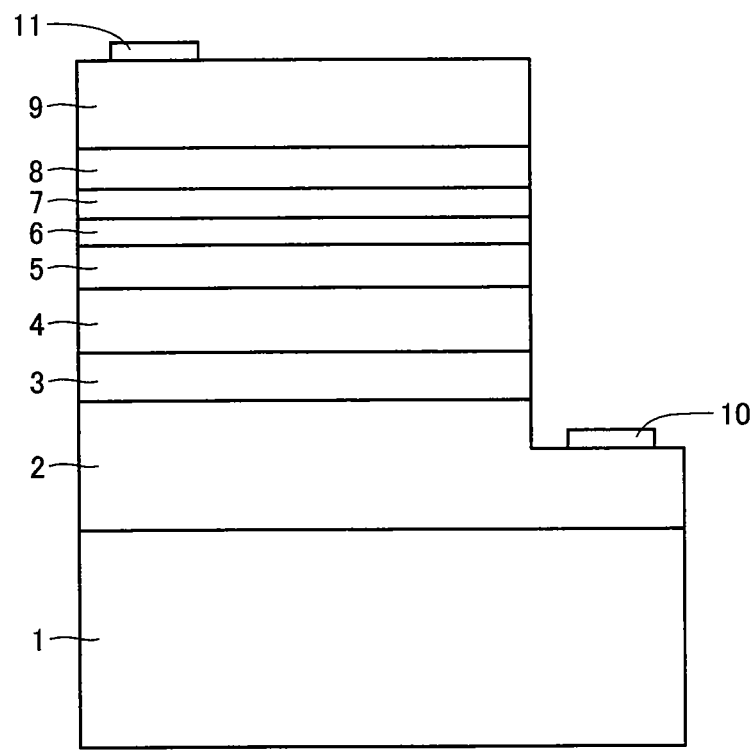
FIG. 1 is a schematic cross-sectional view of a preferred example of a nitride semiconductor light emitting diode device that is an example of a nitride semiconductor light emitting device of the present invention.

In the following, embodiments of the present invention will be described. In the drawings of the invention, like reference characters represent like or corresponding components.

First Embodiment

FIG. 1 shows a schematic cross-sectional view of a preferred example of a nitride semiconductor light emitting diode device which is an example of the nitride semiconductor light emitting device of the present invention. Here, the nitride semiconductor light emitting diode device shown in FIG. 1 is structured to include a substrate 1, and a first n-type nitride semiconductor layer 2, a light emitting layer 3, a first p-type nitride semiconductor layer 4, a second p-type nitride semiconductor layer 5, a p-type nitride semiconductor tunnel junction layer 6, an n-type nitride semiconductor tunnel junction layer 7, an n-type nitride semiconductor vaporization reduction layer 8, and a second n-type nitride semiconductor layer 9 that are successively deposited on substrate 1, and to have an n-side electrode 10 formed on first n-type nitride semiconductor layer 2 and a p-side electrode 11 formed on second n-type nitride semiconductor layer 9.

The nitride semiconductor light emitting device thus structured can have a smaller contact resistance as compared with the conventional structure where the positive electrode is formed at the conventional p-type nitride semiconductor layer and can have a reduced driving voltage, while there is an issue to be addressed of how the voltage loss can be reduced at the tunnel junction which is a junction between p-type nitride semiconductor tunnel junction layer 6 and n-type nitride semiconductor tunnel junction layer 7.

Tunneling probability Tt of the tunnel junction is generally expressed by the following expression (1).

$$Tt=\exp((-8\pi(2m_e)^{1/2}Eg^{3/2})/(3qh\epsilon)) \quad (1)$$

In expression (1) above, Tt represents tunneling probability, $m_e$ represents effective mass of conduction electrons, Eg represents energy gap, q represents charge of electrons, h represents Plank's constant and $\epsilon$ represents electric field applied to the tunnel junction.

In order to reduce the driving voltage of the nitride semiconductor light emitting device, it is desired that this tunneling probability Tt is increased. It is seen from expression (1) above that a possible method for increasing tunneling probability Tt is to reduce energy gap Eg at the tunnel junction and to increase electric field $\epsilon$ applied to the tunnel junction.

In order to reduce energy gap Eg at the tunnel junction, it is preferable that p-type nitride semiconductor tunnel junction layer 6 and n-type nitride semiconductor tunnel junction layer 7 each contain In and the In content ratio is higher. If the In content ratio of p-type nitride semiconductor tunnel junction layer 6 is higher than the In content ratio of light emitting layer 3, the light emitted from light emitting layer 3 is absorbed by the tunnel junction, which is a cause of deterioration of the light extraction efficiency. Therefore, preferably the thickness of p-type nitride semiconductor tunnel junction layer 6 is smaller.

N-type nitride semiconductor tunnel junction layer 7 has a high activation ratio of n-type impurities and thus a high carrier density can be achieved. Therefore, the width of the depletion layer on the n side of the tunnel junction when driven can be reduced. In terms of improvement of the light extraction efficiency, it is preferable that the thickness of n-type nitride semiconductor tunnel junction layer 7 is equal to or smaller than the thickness of p-type nitride semiconductor tunnel junction layer 6.

However, in the case where In in solid phase is to be sufficiently taken into p-type nitride semiconductor tunnel junction layer 6, as described above, the growth temperature has to be decreased to approximately 800° C., and it is difficult to increase the carrier density of p-type nitride semiconductor tunnel junction layer 6.

Accordingly, the present invention has the feature that the In content ratio in p-type nitride semiconductor tunnel junction layer 6 is higher than the In content ratio in second p-type nitride semiconductor layer 5. Because of this structure, p-type nitride semiconductor tunnel junction layer 6 has lattice mismatch with respect to second p-type nitride semiconductor layer 5, and an electric field is generated due to a difference in electron affinity between second p-type nitride semiconductor layer 5 and p-type nitride semiconductor tunnel junction layer 6 at the interface of these layers or in the vicinity of the interface, and accordingly holes of p-type nitride semiconductor tunnel junction layer 6 are attracted to the interface and its vicinity and two-dimensional electron gas is generated. Because of the effect of the generated two-dimensional electron gas, the carrier density can be locally increased in the vicinity of the interface on the side of p-type nitride semiconductor tunnel junction layer 6. Therefore, tunneling probability Tt of the tunnel junction can be increased. As a result, the voltage loss at the tunnel junction can be reduced.

In order to increase electric field ∈ applied to the tunnel junction, respective ionized-impurity densities of p-type nitride semiconductor tunnel junction layer 6 and n-type nitride semiconductor tunnel junction layer 7 may be increased. Here, since it is preferable that the ionized impurity density of p-type nitride semiconductor tunnel junction layer 6 is $1 \times 10^{18}/cm^3$ or more, preferably the doping density of p-type impurities in p-type nitride semiconductor tunnel junction layer 6 is $1 \times 10^{19}/cm^3$ or more. As the p-type impurity of the present invention, Mg (magnesium) and/or Zn (zinc) for example may be used for doping.

Since the ionized impurity density of n-type nitride semiconductor tunnel junction layer 7 is preferably $1 \times 10^{19}/cm^3$ or more, the doping density of the n-type impurity of n-type nitride semiconductor tunnel junction layer 7 is preferably $1 \times 10^{19}/cm^3$ or more. As the n-type impurity of the present invention, Si (silicon) and/or Ge (germanium) for example may be used for doping.

Another method of increasing tunneling probability Tt is to form an intermediate level. One method of forming the intermediate level is to form dislocation for example. In order to form dislocation, second p-type nitride semiconductor layer 5 preferably has lattice mismatch with respect to underlying first p-type nitride semiconductor layer 4 and preferably has a thickness of 2 nm or more, which is preferably a critical thickness or more. In the case where the dislocation is thus formed, the dislocation causes the intermediate level of the tunnel junction. Carriers can also tunnel through the intermediate level, and thus tunneling probability Tt can be increased and it is likely that the driving voltage can be reduced.

The critical thickness is generally expressed by the following expression (2).

$$h_c = (a_e/(2^{1/2}\pi f)) \times ((1-v/4)/(1+v)) \times (\ln(h_c 2^{1/2}/a_e)+1) \quad (2)$$

In expression (2), $h_c$ represents critical thickness of second p-type nitride semiconductor layer 5, $a_e$ represents lattice constant of second p-type nitride semiconductor layer 5, f represents maximum value of the absolute value of $(a_s-a_e)/a_e$, and v represents Poisson's ratio of second p-type nitride semiconductor layer 5. Further, $a_s$ represents lattice constant of first p-type nitride semiconductor layer 4.

As substrate 1, for example, sapphire substrate, silicon substrate, silicon carbide substrate or zinc oxide substrate or the like may be used.

As first n-type nitride semiconductor layer 2, for example, a nitride semiconductor crystal doped with n-type impurities may be used.

As light emitting layer 3, for example, a nitride semiconductor crystal having a single quantum well (SQW) structure or a multi quantum well (MQW) structure may be grown. In particular, preferably the one having a multi quantum well structure including a nitride semiconductor crystal expressed by the composition formula:

$Al_{a1}In_{b1}Ga_{1-(a1+b1)}N$ ($0 \leq a1 \leq 1$, $0 \leq b1 \leq 1$, $0 \leq 1-(a1+b1) \leq 1$)

is used. In the composition formula, a1 represents Al content ratio, b1 represents In content ratio and 1−(a1+b1) represents Ga content ratio.

As first p-type nitride semiconductor layer 4, a nitride semiconductor crystal doped with p-type impurities may be used. For example, a p-type nitride semiconductor layer containing Al on which a p-type GaN layer is grown, or a p-type nitride semiconductor layer containing Al on which a p-type GaN layer is grown on which a p-type nitride semiconductor layer containing In is further grown may be used.

As second p-type nitride semiconductor layer 5, a nitride semiconductor crystal doped with p-type impurities may be used. In the case where second p-type nitride semiconductor layer 5 has lattice mismatch with respect to the uppermost layer of first p-type nitride semiconductor layer 4, preferably dislocation is formed at the stage where the critical thickness is exceeded. Further, in the case where the thickness of p-type nitride semiconductor tunnel junction layer 6 is sufficiently small, for example, 5 mm or less, and a depletion layer is also formed in second p-type nitride semiconductor layer 5, preferably a layer of a nitride semiconductor crystal expressed by the composition formula $In_{x1}Ga_{1-x1}N$ ($0 \leq x1 < 1$) that is doped with p-type impurities may be used. In the above composition formula, x1 represents In content ratio and 1−x1 represents Ga content ratio. Preferably the doping density of the p-type impurities of second p-type nitride semiconductor layer 5 is $1 \times 10^9/cm^3$ or higher. In the case where the doping density of the p-type impurities of second p-type nitride semiconductor layer 5 is less than $1 \times 10^{19}/cm^3$, the resistance of second p-type nitride semiconductor layer 5 increases, possibly resulting in an increased driving voltage.

For example, in the case where first p-type nitride semiconductor layer 4 is a p-type AlGaN layer on which a p-type GaN layer is grown, second p-type nitride semiconductor layer 5 is preferably a layer of a nitride semiconductor crystal expressed by the composition formula $In_{x1}Ga_{1-x1}N$ ($0 \leq x1 < 1$) that is doped with p-type impurities. In the case where the uppermost layer of first p-type nitride semiconductor layer 4 is a p-type AlGaN layer, second p-type nitride semiconductor layer 5 may be p-type GaN layer. Further, in order to prevent the light extraction efficiency from decreasing, the band gap energy of second p-type nitride semiconductor layer 5 may be equal to or larger than the energy corresponding to the wavelength of light emitted from light emitting layer 3.

Further, as described above, preferably p-type nitride semiconductor tunnel junction layer 6 is a nitride semiconductor containing In and preferably the ionized impurity density of p-type nitride semiconductor tunnel junction layer 6 is $1 \times 10^{18}/cm^3$ or higher.

As to the relation of band gap between first p-type nitride semiconductor layer 4, second p-type nitride semiconductor layer 5 and p-type nitride semiconductor tunnel junction layer 6, preferably the band gap of first p-type nitride semiconductor layer 4 is larger than the band gap of second p-type nitride semiconductor layer 5, and the band gap of second p-type nitride semiconductor layer 5 is larger than the band gap of p-type nitride semiconductor tunnel junction layer 6. In the case where the band gap of second p-type nitride semiconductor layer 5 is larger than the band gap of first p-type nitride semiconductor layer 4, the p-type dopant has an increased activation energy to cause a decreased carrier density, possibly resulting in an increased driving voltage.

Further, as described above, in order to increase tunneling probability Tt, preferably n-type nitride semiconductor tunnel junction layer 7 is a nitride semiconductor containing In and preferably the ionized impurity density of n-type nitride semiconductor tunnel junction layer 7 is $1 \times 10^8/cm^3$ or higher. Here, since the ionized impurity density of n-type nitride semiconductor tunnel junction layer 7 can be made higher than that of the p-type nitride semiconductor layer, n-type nitride semiconductor tunnel junction layer 7 may be a nitride semiconductor such as GaN for example without containing In.

Since n-type nitride semiconductor tunnel junction layer 7 has a low donor level and a high activation ratio, the ionized impurity density can be made high, for example, $1 \times 10^{19}/cm^3$ or higher. In view of the small extension of the depletion layer of the tunnel junction toward n-type nitride semiconductor tunnel junction layer 7 and in view of reduction of the amount of absorbed light that is emitted from light emitting layer 3, preferably the thickness of n-type nitride semiconductor tunnel junction layer 7 is 10 nm or less.

N-type nitride semiconductor tunnel junction layer 7 may be doped with p-type impurities together with n-type impurities. In this case, it can be expected for example that diffusion of p-type impurities from p-type nitride semiconductor tunnel junction layer 6 is restrained and an intermediate level is formed within the depletion layer, for example, which can contribute to improvement of the tunneling probability.

P-type nitride semiconductor tunnel junction layer 6 and n-type nitride semiconductor tunnel junction layer 7 may have an opposite-conductivity-type layer and/or an undoped layer respectively. Respective thicknesses of the opposite-conductivity-type layer and the undoped layer may be a thickness (2 nm or less for example) allowing carrier tunneling in the tunnel junction.

Further, as n-type nitride semiconductor vaporization reduction layer 8 is formed, in the case where p-type nitride semiconductor tunnel junction layer 6 and/or n-type nitride semiconductor tunnel junction layer 7 contains In, In can be restrained from vaporizing from these layers.

Here, as n-type nitride semiconductor vaporization reduction layer 8, a layer of a nitride semiconductor crystal expressed by the composition formula $Al_{c1}In_{d1}Ga_{1-(c1+d1)}N$ ($0 \leq c1 \leq 1$, $0 \leq d1 \leq 1$, $0 \leq 1-(c1+d1) \leq 1$) that is doped with n-type impurities may be used and particularly n-type GaN is preferably used. In the above composition formula, c1 represents Al content ratio, d1 represents In content ratio and 1−(c1+d1) represents Ga content ratio.

By forming second n-type nitride semiconductor layer 9, current injected from p-side electrode 11 formed on second n-type nitride semiconductor layer 9 can be diffused.

Here, as second n-type nitride semiconductor layer 9, preferably a nitride semiconductor crystal doped with n-type impurities may be used, and particularly a low-resistance layer is preferred. In particular, desirably it is made of GaN having a carrier density of $1 \times 10^{18}/cm^3$ or higher.

Further, as n-side electrode 10 formed on first n-type nitride semiconductor layer 2 and p-side electrode 11 formed on second n-type nitride semiconductor layer 9, for example, preferably at least one metal selected from the group consisting of Ti (titanium), Hf (hafnium) and Al (aluminum) may be used to form the electrodes such that ohmic contact is formed.

Here, n-side electrode 10 can be formed by etching from the side of second nitride semiconductor layer 9 of the wafer after second n-type nitride semiconductor layer 9 is grown as described above to expose a part of the surface of first n-type nitride semiconductor layer 2 and forming the electrode on the exposed surface.

Alternatively, to a separately prepared electrically conductive support substrate, the side of second n-type nitride semiconductor layer 9 of a wafer after this second n-type nitride semiconductor layer 9 is grown may be attached. Then, the side of first n-type nitride semiconductor layer 2 is the light extraction side and the side of second n-type nitride semiconductor layer 9 is the support substrate side. At least one metal selected from the group consisting of Al, Pt and Ag of high reflectance may be formed on the support substrate side. Thus, the nitride semiconductor light emitting diode device having the top and bottom electrodes structure may be produced.

Regarding such a nitride semiconductor light emitting diode device having the top and bottom electrodes structure, second n-type nitride semiconductor layer 9 can have a higher carrier density than the conventional p-type nitride semiconductor layer. Therefore, regardless of the work function of the metal, the ohmic property obtained by carrier tunneling is more easily achieved. Therefore, a high reflectance metal as described above can be formed on second n-type nitride semiconductor layer 9, showing the tendency that the light extraction efficiency is improved.

Second Embodiment

Figure 2:
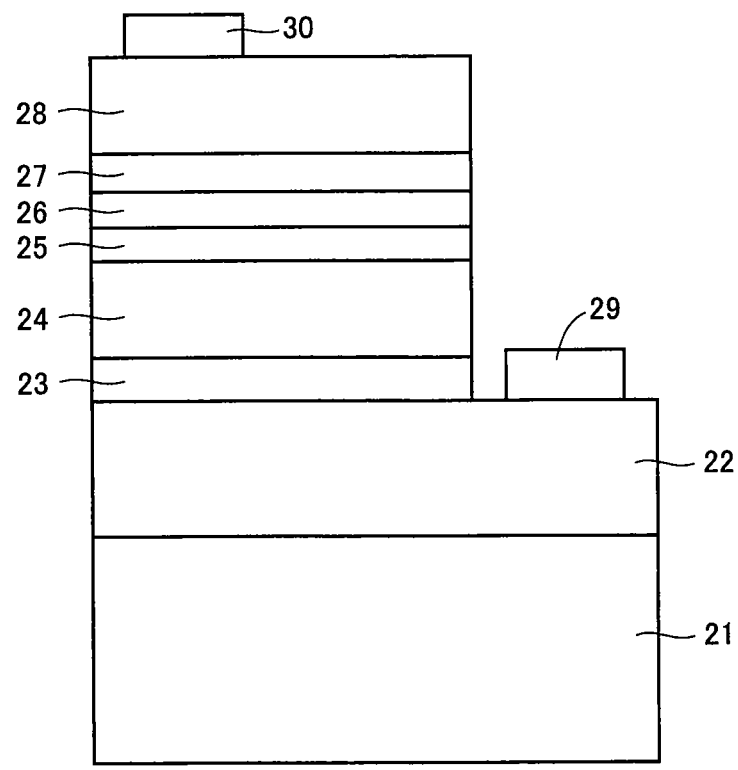
FIG. 2 is a schematic cross-sectional view of a nitride semiconductor light emitting diode device in Examples 1 to 2.

FIG. 2 shows a schematic cross-sectional view of a preferred example of a nitride semiconductor light emitting diode device that is one example of the nitride semiconductor light emitting device of the present invention. Here, the nitride semiconductor light emitting diode device shown in FIG. 2 is structured to include a substrate 21, and a first n-type nitride semiconductor layer 22, a light emitting layer 23, a p-type nitride semiconductor layer 24, a p-type nitride semiconductor tunnel junction layer 25, an n-type nitride semiconductor tunnel junction layer 26, an n-type nitride semiconductor vaporization reduction layer 27 and a second n-type nitride semiconductor layer 28 that are successively deposited on substrate 21, and to have an n-side electrode 29 formed on first n-type nitride semiconductor layer 22 and a p-side electrode 30 formed on second n-type nitride semiconductor layer 28.

The nitride semiconductor light emitting device thus structured can have a smaller contact resistance as compared with the conventional structure where the positive electrode is formed at the conventional p-type nitride semiconductor layer and can have a reduced driving voltage, while there is an issue to be addressed of how the voltage loss can be reduced at the tunnel junction which is a junction between p-type nitride semiconductor tunnel junction layer 25 and n-type nitride semiconductor tunnel unction layer 26.

Tunneling probability Tt of this tunnel junction is also generally expressed by the above expression (1).

In order to reduce the driving voltage of the nitride semiconductor light emitting device, it is desired that this tunneling probability Tt is increased. It is seen from expression (1) above that a possible method for increasing tunneling probability Tt is to reduce energy gap Eg at the tunnel junction and to increase electric field ϵ applied to the tunnel junction.

Regarding the conventional nitride semiconductor light emitting diode device structured to have the tunnel junction between the p-type InGaN layer and the n-type InGaN layer as disclosed in Patent Document 1 for example, it is suggested, as a method of reducing energy gap Eg of the tunnel junction, to increase the In content of the p-type InGaN layer and the In content of the n-type InGaN layer. As a method of increasing electric field ϵ applied to the tunnel junction, it is suggested to increase the ionized impurity density of the p-type InGaN layer and that of the n-type InGaN layer.

However, for the conventional nitride semiconductor light emitting diode device disclosed in Patent Document 1, it is necessary to grow the p-type InGaN layer and grow the n-type InGaN layer each at a low temperature of 900° C. or less for allowing In to be contained in solid phase, resulting in deterioration of the crystallinity of these layers. Further, since the p-type InGaN layer and the n-type InGaN layer are each ternary mixed crystal, there are many lattice defects such as point defects and line defects. Furthermore, in order to increase the ionized impurity density, high-density impurity doing is performed. Because of these factors, the nitride semiconductor light emitting diode device has deteriorated reliability.

Accordingly, the inventor of the present invention has thoroughly studied to find that the reliability is improved and thus achieved the present invention, by allowing at least one of p-type nitride semiconductor tunnel junction layer 25 and n-type nitride semiconductor tunnel junction layer 26 forming the tunnel junction to contain Al, even in the case where p-type nitride semiconductor tunnel junction layer 25 and n-type nitride semiconductor tunnel junction layer 26 are grown at a low temperature or in the case where high-density impurity doping is performed for increasing the ionized impurity concentration.

Here, in the case where p-type nitride semiconductor tunnel junction layer 25 and/or n-type nitride semiconductor tunnel junction layer 26 contains Al, it is preferable, in terms of restraining the driving voltage from increasing, that the Al content is 1 atomic % or higher and 5 atomic % or lower. For example, it is preferable that a material prepared by doping a nitride semiconductor crystal of a quaternary mixed crystal expressed by the composition formula $Al_{x2}In_{y2}Ga_{1-(x2+y2)}N$ ($0.01 < x2 \leq 0.05$, $0 < y2 < 1$, $x2 < y2$) with p-type impurities and/or n-type impurities is used as p-type nitride semiconductor tunnel junction layer 25 and/or n-type nitride semiconductor tunnel junction layer 26. In the above composition formula, x2 represents Al content ratio, y2 represents In content ratio and $1-(x2+y2)$ represents Ga content ratio.

In order to reduce the driving voltage, it is preferable that the ionized impurity density of p-type nitride semiconductor tunnel junction layer 25 is $1 \times 10^{18}/cm^3$ or higher. Therefore, it is preferable that the doping density of p-type impurities of p-type nitride semiconductor tunnel junction layer 25 is $1 \times 10^{19}/cm^3$ or higher. For the present invention, as the p-type impurity, Mg (magnesium) and/or Zn (zinc) for example may be used for doping.

Further, in order to reduce the driving voltage, it is preferable that the ionized impurity density of n-type nitride semiconductor tunnel junction layer 26 is $1 \times 10^{19}/cm^3$ or higher. Therefore, it is preferable that the doping density of n-type impurities of n-type nitride semiconductor tunnel junction layer 26 is $1 \times 10^{19}/cm^3$ or higher. For the present invention, as the n-type impurity, Si (silicon) and/or Ge (germanium) for example may be used for doping.

Since n-type nitride semiconductor tunnel junction layer 26 has a low donor level and a high activation ratio, the ionized impurity density can be made high, for example, $1 \times 10^{19}/cm^3$ or higher. In view of the small extension of the depletion layer of the tunnel junction toward n-type nitride semiconductor tunnel junction layer 26 and in view of reduction of the amount of absorbed light that is emitted from light emitting layer 23, preferably the thickness of n-type nitride semiconductor tunnel junction layer 26 is 10 nm or less.

N-type nitride semiconductor tunnel junction layer 26 may be doped with p-type impurities together with n-type impurities. In this case, it can be expected for example that diffusion of p-type impurities from p-type nitride semiconductor tunnel junction layer 25 is restrained and an intermediate level is formed within the depletion layer, which can contribute to improvement of the tunneling probability.

P-type nitride semiconductor tunnel junction layer 25 and n-type nitride semiconductor tunnel junction layer 26 may have an opposite-conductivity-type layer and/or an undoped layer respectively. Respective thicknesses of the opposite-conductivity-type layer and the undoped layer may be a thickness (2 nm or less for example) allowing carrier to tunnel in the tunnel junction.

As substrate 21, silicon substrate, silicon carbide substrate or zinc oxide substrate for example may be used.

As first n-type nitride semiconductor layer 22, for example, a nitride semiconductor crystal doped with n-type impurities may be used.

As light emitting layer 23, for example, a nitride semiconductor crystal having a single quantum well (SQW) structure or a multi quantum well (MQW) structure may be grown. In particular, preferably the one having a multi quantum well structure including a nitride semiconductor crystal expressed by the composition formula:

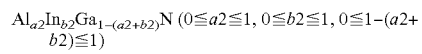

$Al_{a2}In_{b2}Ga_{1-(a2+b2)}N$ ($0 \leq a2 \leq 1$, $0 \leq b2 \leq 1$, $0 \leq 1-(a2+b2) \leq 1$)

is used. In the composition formula, a2 represents Al content ratio, b2 represents In content ratio and $1-(a2+b2)$ represents Ga content ratio.

As p-type nitride semiconductor layer 24, for example, a nitride semiconductor crystal doped with p-type impurities may be used. In particular, the one having a p-type cladding layer containing Al on which a p-type GaN layer is grown may be used.

As n-type nitride semiconductor vaporization reduction layer 27 is formed, in the case where p-type nitride semiconductor tunnel junction layer 25 and/or n-type nitride semiconductor tunnel junction layer 26 contains In, In can be restrained from vaporizing from these layers.

Here, as n-type nitride semiconductor vaporization reduction layer 27, a layer of a nitride semiconductor crystal expressed by the composition formula $Al_{c2}In_{d2}Ga_{1-(c2+d2)}N$ ($0 \leq c2 \leq 1$, $0 \leq d2 \leq 1$, $0 \leq 1-(c2+d2) \leq 1$) that is doped with n-type impurities may be used and particularly n-type GaN is preferably used. In the above composition formula, c2 represents Al content ratio, d2 represents In content ratio and 1−(c2+d2) represents Ga content ratio. Further, preferably n-type nitride semiconductor vaporization reduction layer 27 is grown at a temperature approximately equal to that for p-type nitride semiconductor tunnel junction layer 25 and/or n-type nitride semiconductor tunnel junction layer 26.

By forming second n-type nitride semiconductor layer 28, current injected from p-side electrode 30 formed on second n-type nitride semiconductor layer 28 can be diffused.

Here, as second n-type nitride semiconductor layer 28, preferably a nitride semiconductor crystal doped with n-type impurities may be used, and particularly a low-resistance layer is preferred. In particular, GaN having a carrier density of $1 \times 10^{18}/cm^3$ or higher is desired.

As n-side electrode 29 formed on first n-type nitride semiconductor layer 22 and p-side electrode 30 formed on second n-type nitride semiconductor layer 28, for example, preferably at least one metal selected from the group consisting of Ti (titanium), Hf (hafnium) and Al (aluminum) may be used so that an ohmic contact is formed.

Here, n-side electrode 29 can be formed by etching from the side of second nitride semiconductor layer 28 of the wafer after second n-type nitride semiconductor layer 28 is grown as described above to expose a part of the surface of first n-type nitride semiconductor layer 22 and forming the electrode on the exposed surface.

Alternatively, to a separately prepared electrically conductive support substrate, the side of second n-type nitride semiconductor layer 28 of a wafer after this second n-type nitride semiconductor layer 28 is grown may be attached. Then, the side of first n-type nitride semiconductor layer 22 is the light extraction side and the side of second n-type nitride semiconductor layer 28 is the support substrate side. At least one metal selected from the group consisting of Al, Pt and Ag of high reflectance may be formed on the support substrate side. Thus, the nitride semiconductor light emitting diode device having the top and bottom electrodes structure may be produced.

Regarding such a nitride semiconductor light emitting diode device having the top and bottom electrodes structure, second n-type nitride semiconductor layer 28 can have a higher carrier density than the conventional p-type nitride semiconductor layer. Therefore, regardless of the work function of the metal, the ohmic property obtained by carrier tunneling is more easily achieved. Therefore, a high reflectance metal as described above can be formed on second n-type nitride semiconductor layer 28, showing the tendency that the light extraction efficiency is improved.

EXAMPLE 1

Figure 3:
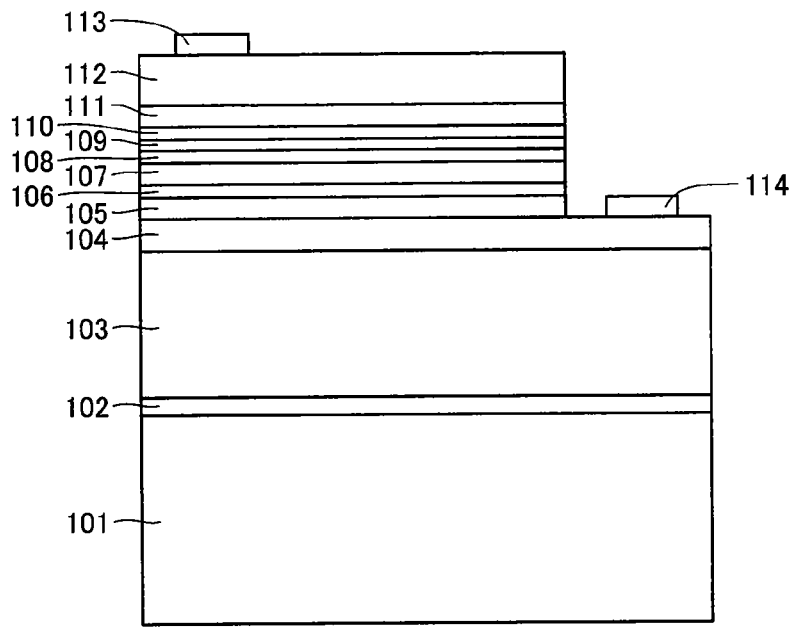
FIG. 3 shows a relation between a thickness of a p-type InGaN layer and a driving voltage of the nitride semiconductor light emitting diode device in Example 1.

In Example 1, a nitride semiconductor light emitting diode device structured as shown in the schematic cross sectional view of FIG. 3 was fabricated. Here, the nitride semiconductor light emitting diode device in Example 1 was structured to include, on a sapphire substrate 101, a GaN buffer layer 102, an n-type GaN underlying layer 103, an n-type GaN contact layer 104, a light emitting layer 105, a p-type AlGaN cladding layer 106, a p-type GaN contact layer 107, a p-type InGaN layer 108, a p-type tunnel junction layer 109, an n-type tunnel junction layer 110, an n-type GaN vaporization reduction layer 111 and n-type GaN layer 112 that are deposited in this order, and to have a pad electrode 113 formed on the surface of n-type GaN layer 112 and a pad electrode 114 formed on the surface of n-type GaN contact layer 104.

First, sapphire substrate 101 was set in a reactor of an MOCVD apparatus. While hydrogen was supplied into the reactor, the temperature of sapphire substrate 101 was increased to 1050° C. to clean the surface (c plane) of sapphire substrate 101.

Next, the temperature of sapphire substrate 101 was decreased to 510° C. and hydrogen was supplied as a carrier gas and ammonia and TMG (trimethylgallium) were supplied as source material gasses into the reactor to grow, on the surface (c plane) of sapphire substrate 101, GaN buffer layer 102 by the MOCVD to a thickness of approximately 20 nm.

Subsequently, the temperature of sapphire substrate 101 was increased to 1050° C. and hydrogen was supplied as a carrier gas, ammonia and TMG were supplied as source material gases and silane was supplied as impurity gas into the reactor to grow Si-doped n-type GaN underlying layer 103 (carrier density: $1 \times 10^{18}/cm^3$) by the MOCVD to a thickness of 6 μm on GaN buffer layer 102.

Then, n-type GaN contact layer 104 was grown by the MOCVD to a thickness of 0.5 μm on n-type GaN underlying layer 103, in a similar manner to that for n-type GaN underlying layer 103, except that Si doping was performed to provide the carrier density of $5 \times 10^{18}/cm^3$.

Then, the temperature of sapphire substrate 101 was decreased to 700° C. and hydrogen was supplied as a carrier gas and ammonia, TMG and TMI (trimethylindium) were supplied as source material gasses into the reactor to grow, on n-type GaN contact layer 104, an $In_{0.25}Ga_{0.75}N$ layer of 2.5 nm in thickness and a GaN layer of 18 nm in thickness alternately in the 6-cycle by the MOCVD and thereby form light emitting layer 105 having the multi quantum well structure on n-type GaN contact layer 104. As apparently seen, in the process of forming light emitting layer 105, TMI was not supplied into the reactor in growing the GaN layer.

Then, the temperature of sapphire substrate 101 was increased to 950° C. and hydrogen was supplied as a carrier gas, ammonia, TMG and TMA (trimethylaluminum) were supplied as source material gases and CP2Mg (cyclopentadienyl magnesium) was supplied as an impurity gas into the reactor to grow p-type AlGaN cladding layer 106 of $Al_{0.15}Ga_{0.85}N$ doped with Mg with a density of $1 \times 10^{20}/cm^3$ by the MOCVD to a thickness of approximately 30 nm on light emitting layer 105.

Then, the temperature of sapphire substrate 101 was kept at 950° C. and hydrogen was supplied as a carrier gas, ammonia and TMG were supplied as source material gases and CP2Mg was supplied as an impurity gas into the reactor to grow p-type GaN contact layer 107 of GaN doped with Mg with a density of $1 \times 10^{20}/cm^3$ by the MOCVD on p-type AlGaN cladding layer 106 to a thickness of 0.1 μm.

Then, the temperature of sapphire substrate 101 was decreased to 700° C. and nitrogen was supplied as a carrier gas, ammonia, TMG and TMI were supplied as source material gases and CP2Mg was supplied as an impurity gas into the reactor to grow p-type InGaN layer 108, which is a second p-type nitride semiconductor layer of $In_{0.25}Ga_{0.75}N$ doped with Mg with a density of $1 \times 10^{20}/cm^3$ by the MOCVD on p-type GaN contact layer 107 to a predetermined thickness in the range of 0 to 50 nm.

Then, the temperature of sapphire substrate 101 was decreased to 670° C. and nitrogen was supplied as a carrier gas, ammonia, TMG and TMI were supplied as source material gases and CP2Mg was supplied as an impurity gas into the reactor to grow p-type tunnel junction layer 109 of $In_{0.30}Ga_{0.70}N$ doped with Mg with a density of $1 \times 10^{20}/cm^3$ by the MOCVD on p-type InGaN layer 108 to a thickness of 2 nm.

Then, the temperature of sapphire substrate 101 was kept at 670° C. and nitrogen was supplied as a carrier gas, ammonia, TMG and TMI were supplied as source material gases and silane was supplied as an impurity gas into the reactor to grow n-type tunnel junction layer 110 (carrier density: $5\times10^{19}/cm^3$) of $In_{0.30}Ga_{0.70}N$ doped with Si by the MOCVD on p-type tunnel junction layer 109 to a thickness of 4 nm.

Then, the temperature of sapphire substrate 101 was kept at 670° C. and nitrogen was supplied as a carrier gas, ammonia and TMG were supplied as source material gases and silane was supplied as an impurity gas into the reactor to grow n-type GaN vaporization reduction layer 111 (carrier density: $5\times10^{19}/cm^3$) of GaN doped with Si on n-type tunnel junction layer 110 to a thickness of 15 nm.

Then, the temperature of sapphire substrate 101 was increased to 950° C. and hydrogen was supplied as a carrier gas, ammonia and TMG were supplied as source material gases an silane was supplied as an impurity gas into the reactor to grow n-type GaN layer 112 of GaN doped with Si with a density of $1\times10^{19}/cm^3$ by the MOCVD on n-type GaN vaporization reduction layer 111 to a thickness of 0.2 μm.

Then, the temperature of sapphire substrate 101 was decreased to 700° C. and nitrogen was supplied as a carrier gas into the reactor to perform annealing.

The wafer after the annealing was removed from the reactor and, on the surface of the uppermost layer of the wafer, namely n-type GaN layer 112, a patterned mask was formed. By the RIE (Reactive Ion Etching), a part of the wafer was etched from the side of n-type GaN layer 112 to expose a part of the surface of n-type GaN contact layer 104.

Then, on the surface of n-type GaN layer 112, pad electrode 113 was formed and, on n-type GaN contact layer 104, pad electrode 114 was formed. Here, pad electrode 113 and pad electrode 114 were simultaneously formed by successively depositing a Ti layer and an Al layer on respective surfaces of n-type GaN layer 112 and n-type GaN contact layer 104. After this, the wafer was divided into a plurality of chips to produce the nitride semiconductor light emitting diode device in Example 1 having the structure shown in the schematic cross-sectional view in FIG. 3.

Figure 4:
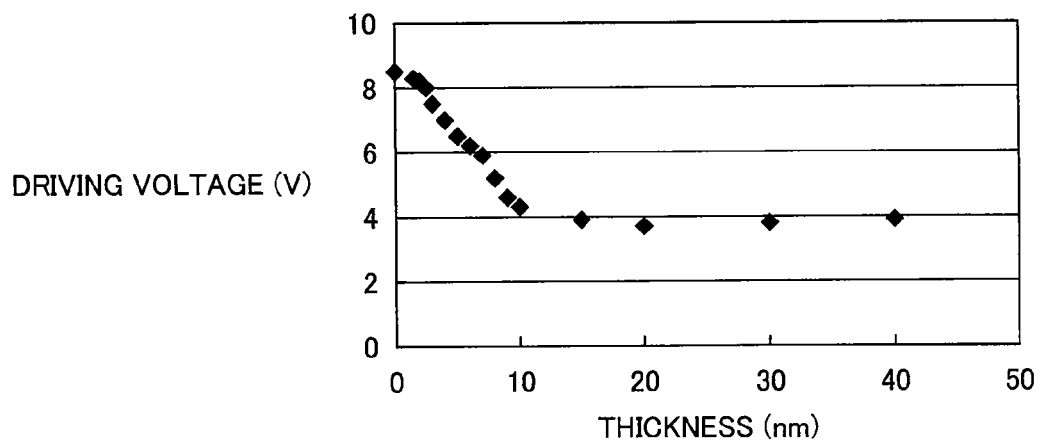
FIG. 4 shows a relation between a thickness of a p-type tunnel junction layer and a driving voltage of the nitride semiconductor light emitting diode device in Example 2.

FIG. 4 shows a relation between a thickness of p-type InGaN layer 108 and a driving voltage of the nitride semiconductor light emitting diode device in Example 1. In FIG. 4, the vertical axis indicates a driving voltage (V) when current of 20 mA is injected and the horizontal axis indicates a thickness (nm) of p-type InGaN layer 108.

As shown in FIG. 4, until the thickness of 20 nm of p-type InGaN layer 108 is reached, the driving voltage decreases as the thickness of p-type InGaN layer 108 increases. In the case where the thickness of p-type InGaN layer 108 which is the second p-type nitride semiconductor layer is 10 nm or less, it is confirmed that the driving voltage dramatically decreases.

EXAMPLE 2

A nitride semiconductor light emitting diode device was fabricated under the same conditions and by the same method as those of Example 1 to the step of growing p-type GaN contact layer 107.

The temperature of sapphire substrate 101 was decreased to 700° C. and nitrogen was supplied as a carrier gas, ammonia, TMG and TMI were supplied as source material gases and CP2Mg was supplied as an impurity gas into the reactor to grow p-type InGaN layer 108 which is the second p-type nitride semiconductor layer of $In_{0.25}Ga_{0.75}N$ doped with Mg with a density of $1\times10^{20}/cm^3$ by the MOCVD on p-type GaN contact layer 107 to a thickness of 20 nm.

After this, the temperature of sapphire substrate 101 was decreased to 670° C., nitrogen was supplied as a carrier gas, ammonia, TMG and TMI were supplied as source material gases and CP2Mg was supplied as an impurity gas into the reactor to grow p-type tunnel junction layer 109 of $In_{0.30}Ga_{0.70}N$ doped with Mg with a density of $1\times10^{20}/cm^3$ by the MOCVD on p-type InGaN layer 108 to a predetermined thickness in the range of 0 to 10 nm.

After this, under the same conditions and by the same method as those of Example 1, the nitride semiconductor light emitting diode device in Example 2 was produced.

Figure 5:
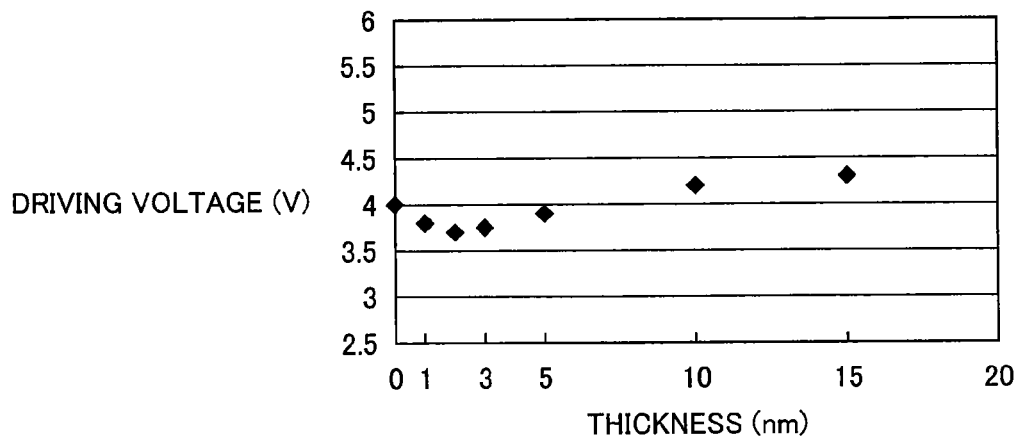
FIG. 5 shows a relation between a thickness of the p-type tunnel junction layer and an optical output of the nitride semiconductor light emitting diode device in Example 2.

FIG. 5 shows a relation between a thickness of p-type tunnel junction layer 109 and a driving voltage of the nitride semiconductor light emitting diode device in Example 2. In FIG. 5, the vertical axis indicates a driving voltage (V) when current of 20 mA is injected and the horizontal axis indicates a thickness (nm) of p-type tunnel junction layer 109.

As shown in FIG. 5, in the case where the thickness of p-type tunnel junction layer 109 is 5 nm or less, the driving voltage is lower. In the case where the thickness of p-type tunnel junction layer 109 is 1 nm or more and 3 nm or less, the driving voltage is particularly lower.

Figure 6:
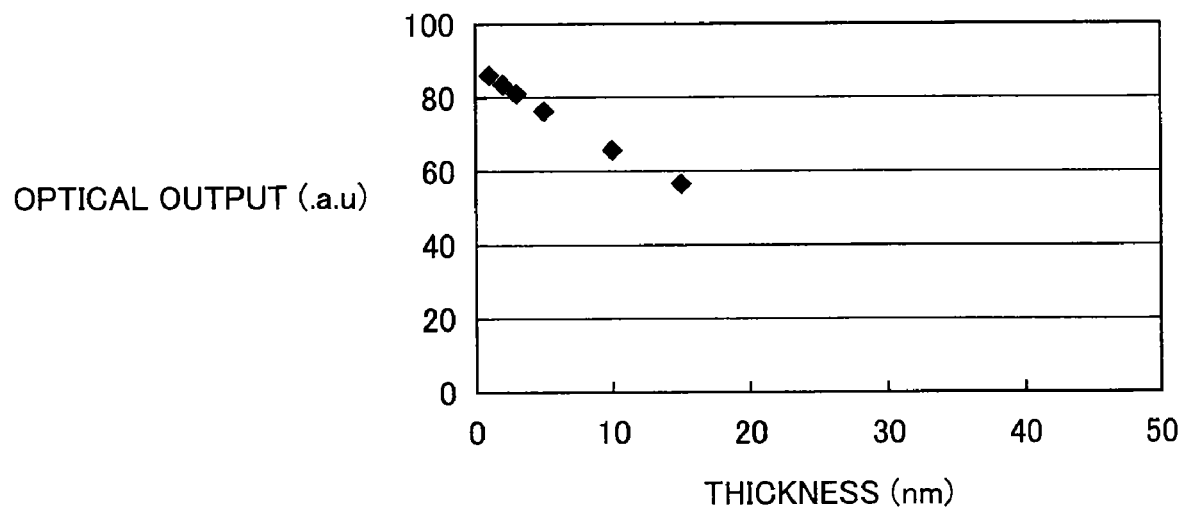
FIG. 6 is a schematic cross-sectional view of a nitride semiconductor light emitting diode device in Example 3.

FIG. 6 shows a relation between a thickness of p-type tunnel junction layer 109 and an optical output of the nitride semiconductor light emitting diode device in Example 2. In FIG. 6, the vertical axis indicates an optical output (.a.u) and the horizontal axis indicates a thickness (nm) of p-type tunnel junction layer 109.

As shown in FIG. 6, it is confirmed that the optical output decreases as the thickness of p-type tunnel junction layer 109 decreases.

From the results of FIGS. 5 and 6, it is confirmed that, in terms of the reduction of the driving voltage and the improvement of the optical output, preferably the thickness of p-type tunnel junction layer 109 is 5 nm or less and more preferably 1 nm or more and 3 nm or less.

EXAMPLE 3

Figure 7:
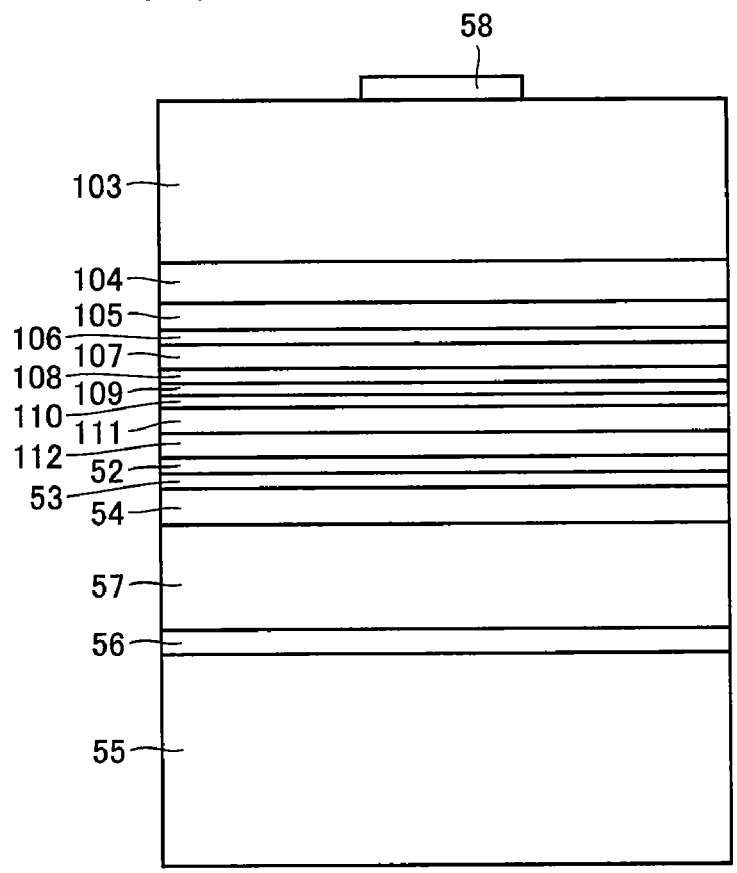
FIG. 7 is a schematic cross-sectional view of a nitride semiconductor light emitting diode device in Comparative Example 1.

In Example 3, a nitride semiconductor light emitting diode device structured as shown by the schematic cross-sectional view of FIG. 7 was fabricated. Here, the nitride semiconductor light emitting diode device in Example 3 was structured to include, on an electrically conductive substrate 55, an ohmic electrode layer 56, a first bonding metal layer 57, a second bonding metal layer 54, a barrier layer 53, a reflective layer 52, an n-type GaN layer 112, an n-type GaN vaporization reduction layer 111, an n-type tunnel junction layer 110, a p-type tunnel junction layer 109, a p-type InGaN layer 108, a p-type GaN contact layer 107, a p-type AlGaN cladding layer 106, a light emitting layer 105, an n-type GaN contact layer 104, an n-type GaN underlying layer 103 and a pad electrode 58 deposited successively.

In Example 3, the diode device was produced in a similar manner to that of Example 1 to the step of growing p-type GaN contact layer 107.

Then, the temperature of sapphire substrate 101 was decreased to 700° C., and nitrogen was supplied as a carrier gas, ammonia, TMG and TMI were supplied as source material gases and CP2Mg was supplied as an impurity gas into the reactor to grow p-type InGaN layer 108 which was the second p-type nitride semiconductor layer of $In_{0.25}Ga_{0.75}N$ doped with Mg with a density of $1\times10^{20}/cm^3$ by the MOCVD on p-type GaN contact layer 107 to a thickness of 20 nm.

After this, the temperature of sapphire substrate 101 was decreased to 670° C., and nitrogen was supplied as a carrier gas, ammonia, TMG and TMI were supplied as source material gases and CP2Mg was supplied as an impurity gas into the reactor to grow p-type tunnel junction layer 109 of $In_{0.30}Ga_{0.70}N$ doped with Mg with a density of $1\times10^{20}/cm^3$ by the MOCVD on p-type InGaN layer 108 to a thickness of 2 nm.

Then, the temperature of sapphire substrate 101 was kept at 670° C., and nitrogen was supplied as a carrier gas, ammonia, TMG and TMI were supplied as source material gases and silane was supplied as an impurity gas into the reactor to grow n-type tunnel junction layer 110 (carrier density: $5\times10^{19}/cm^3$) of $In_{0.30}Ga_{0.70}N$ doped with Si by the MOCVD on p-type tunnel junction layer 109 to a thickness of 4 nm.

After this, the temperature of sapphire substrate 101 was kept at 670° C. and nitrogen was supplied as a carrier gas, ammonia and TMG were supplied as source material gases and silane was supplied as an impurity gas into the reactor to grow n-type GaN vaporization reduction layer 111 (carrier density: $5\times10^{19}/cm^3$) of GaN doped with Si on n-type tunnel junction layer 110 to a thickness of 15 nm.

After this, the temperature of sapphire substrate 101 was increased to 950° C. and hydrogen was supplied as a carrier gas, ammonia and TMG were supplied as source material gases and silane was supplied as an impurity gas into the reactor to grow n-type GaN layer 112 of GaN doped with Si with a density of $1\times10^{19}/cm^3$ by the MOCVD on n-type GaN vaporization reduction layer 111 to a thickness of 0.2 μm.

Then, the temperature of sapphire substrate 101 was decreased to 700° C. and nitrogen was supplied as a carrier gas into the reactor to perform annealing.

After the annealing, on the surface of n-type GaN layer 112, reflective layer 52 formed of an Ag layer of 150 nm in thickness, barrier layer 53 formed of an Mo layer of 50 nm in thickness and second bonding metal layer 54 formed of an Au layer of 3 μm in thickness were formed in this order by the EB (Electron Beam) vapor deposition.

Then, on separately-prepared electrically conductive substrate 55 of electrically conductive Si of 120 μm in thickness, the EB vapor deposition was used to deposit, in the following order, ohmic electrode layer 56 having a Ti layer of 15 nm in thickness and an Al layer of 150 nm in thickness deposited in this order as well as first bonding metal layer 57 having an Au layer of 100 nm in thickness and an AuSn layer of 3 μm in thickness deposited in this order.

Then, the AuSn layer located at the surfacemost layer of first bonding metal layer 57 and the Au layer located at the surfacemost layer of second bonging metal layer 54 were disposed opposite to each other. The eutectic bonding method was used to bond first bonding metal layer 57 and second bonding metal layer 54. The temperature in the eutectic bonding process was set at 290° C.

Subsequently, the rear surface side of sapphire substrate 101 which was mirror-polished was irradiated with the third harmonic (wavelength: 355 nm) of YAG laser radiation to thermally decompose the interface portion between GaN buffer layer 102 formed on sapphire substrate 101 and n-type GaN underlying layer 103 to remove sapphire substrate 101 and GaN buffer layer 102.

After this, on the surface of n-type GaN underlying layer 103 exposed as a result of removal of sapphire substrate 101 and GaN buffer layer 102, a Ti layer and an Au layer were deposited in this order to form pad electrode 58. The wafer after pad electrode 58 was formed was divided into a plurality of chips to produce the nitride semiconductor light emitting diode device in Example 3 structured as shown in the schematic cross-sectional view in FIG. 7. For the nitride semiconductor light emitting diode device in Example 3, in order to reduce the contact resistance between n-type GaN underlying layer 103 and pad electrode 58, the carrier density of n-type GaN underlying layer 103 was set to $5\times10^{18}/cm^3$.

It was confirmed that, the driving voltage when current of 20 mA was injected for the nitride semiconductor light emitting diode device in Example 3 was 4.0 V, which is lower than the driving voltage for the conventional semiconductor light emitting diode device (the nitride semiconductor light emitting diode device in Comparative Example 1) having the top and bottom electrodes structure as described below.

COMPARATIVE EXAMPLE 1

Figure 8:
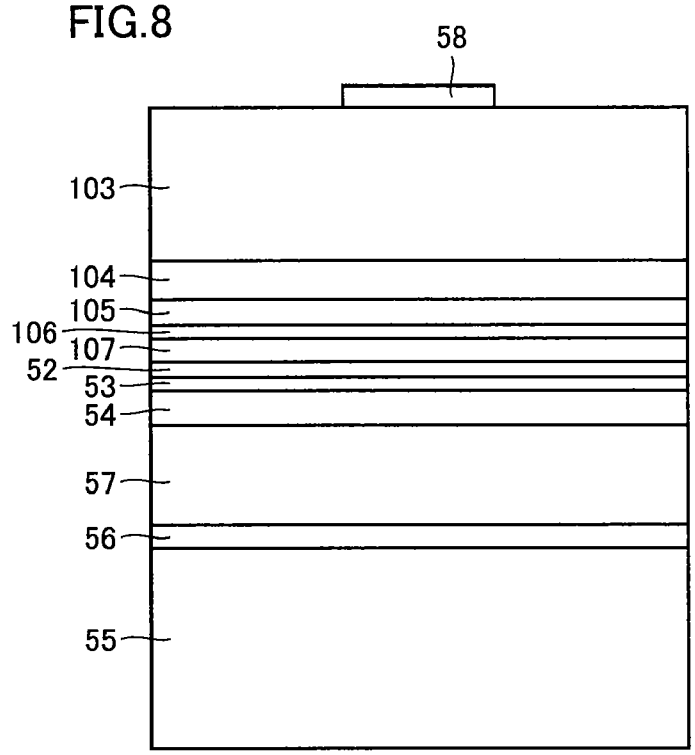
FIG. 8 is a schematic cross-sectional view of a preferred example of the nitride semiconductor light emitting diode device that is an example of the nitride semiconductor light emitting device of the present invention.

In Comparative Example 1, a nitride semiconductor light emitting diode device structured as shown in the schematic cross-sectional view of FIG. 8 was fabricated. Here, the nitride semiconductor light emitting diode device in Comparative Example 1 was structured to include, on an electrically conductive substrate 55, an ohmic electrode layer 56, a first bonding metal layer 57, a second bonding metal layer 54, a barrier layer 53, a reflective layer 52, a p-type GaN contact layer 107, a p-type AlGaN cladding layer 106, a light emitting layer 105, an n-type GaN contact layer 104, n-type GaN underlying layer 103 and pad electrode 58 that were successively deposited.

The nitride semiconductor light emitting diode device in Comparative Example 1 was structured identically to the nitride semiconductor light emitting diode device in Example 3 except that p-type InGaN layer 108, p-type tunnel junction layer 109, n-type tunnel junction layer 110, n-type GaN vaporization reduction layer 111 and n-type GaN layer 112 were not formed.

For the nitride semiconductor light emitting diode device in Comparative Example 1, the driving voltage when current of 20 mA was injected was 6.0 V. It was confirmed that the driving voltage was higher than the driving voltage of the nitride semiconductor light emitting diode device in Example 3 when current of 20 mA was injected. One reason is that the contact resistance between p-type GaN contact layer 107 and reflective layer 52 formed of an Ag layer is high.

For the nitride semiconductor light emitting diode device in Comparative Example 1, in order to reduce the driving voltage, such a metal having a high work function as Pd or Ni may be used to form a thin film of approximately a few nm between p-type GaN contact layer 107 and reflective layer 52 formed of the Ag layer. In this case, however, because of a low reflectance of Pd and Ni, the light from light emitting layer 105 could be absorbed to decrease the optical output.

EXAMPLE 4

Figure 9:
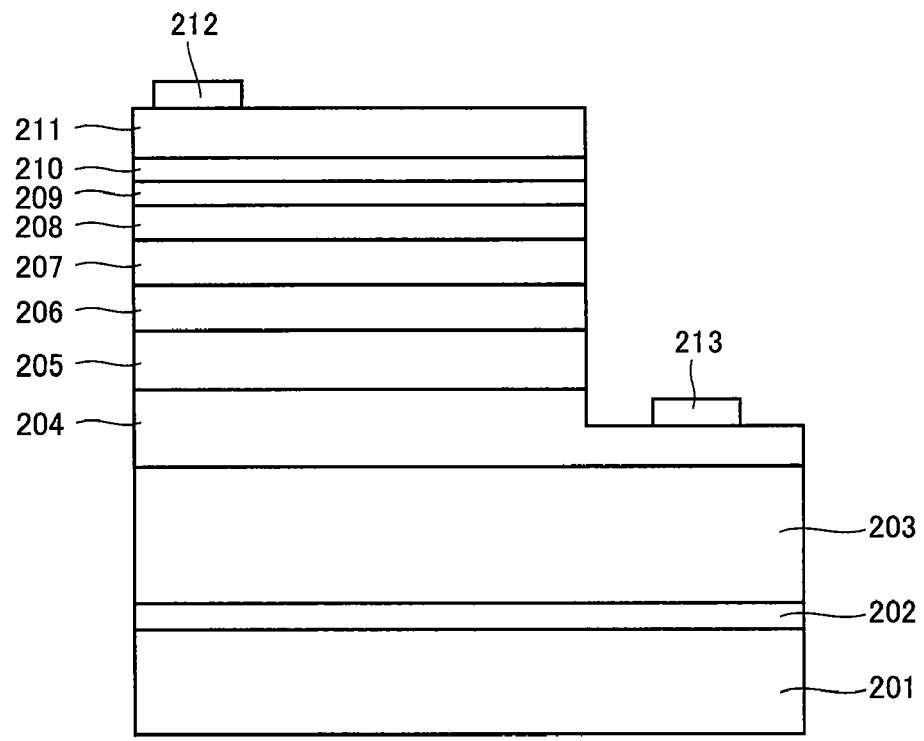
FIG. 9 is a schematic cross-sectional view of a nitride semiconductor light emitting diode device in Examples 4 to 6.

In Example 4, a nitride semiconductor light emitting diode device structured as shown in the schematic cross-sectional view of FIG. 9 was fabricated. Here, the nitride semiconductor light emitting diode device in Example 4 was structured to include, on a sapphire substrate 201, a GaN buffer layer 202, an n-type GaN underlying layer 203, an n-type GaN contact layer 204, a light emitting layer 205, a p-type AlGaN cladding layer 206, a p-type GaN contact layer 207, a p-type tunnel junction layer 208, an n-type tunnel junction layer 209, an n-type GaN vaporization reduction layer 210 and n-type GaN layer 211 deposited in this order and to have a pad electrode 212 formed on the surface of n-type GaN layer 211 and a pad electrode 213 formed on the surface of n-type GaN contact layer 204.

First, sapphire substrate 201 was set in a reactor of an MOCVD apparatus. While hydrogen was supplied into the reactor, the temperature of sapphire substrate 201 was increased to 1050° C. to clean the surface (c plane) of sapphire substrate 201.

Then, the temperature of sapphire substrate 201 was decreased to 510°C., and hydrogen was supplied as a carrier gas and ammonia and TMG (trimethylgallium) were supplied as source material gases into the reactor to form GaN buffer layer 202 on the surface (c plane) of sapphire substrate 201 by the MOCVD to a thickness of approximately 20 nm.

Then, the temperature of sapphire substrate 201 was increased to 1050° C., and hydrogen was supplied as a carrier gas, ammonia and TMG were supplied as source material gases and silane was supplied as an impurity gas into the reactor to grow n-type GaN underlying layer 203 (carrier density: $1\times10^{18}/cm^3$) doped with Si by the MOCVD to a thickness of 6 µm on GaN buffer layer 202.

Then, n-type GaN contact layer 204 was grown by the MOCVD to a thickness of 0.5 µm on n-type GaN underlying layer 203, in a similar manner to that of n-type GaN underlying layer 203 except that doping with Si was performed to provide the carrier density of $5\times10^{18}/cm^3$.

Then the temperature of sapphire substrate 201 was decreased to 700° C., and hydrogen was supplied as a carrier gas and ammonia, TMG and TMI (trimethylindium) were supplied as source material gases into the reactor to grow, on n-type GaN contact layer 204, an $In_{0.25}Ga_{0.75}N$ layer of 2.5 nm in thickness and a GaN layer of 18 nm in thickness alternately in the 6-cycle by the MOCVD and thereby form light emitting layer 205 having the multi quantum well structure on n-type GaN contact layer 204. As apparently seen, in the step of forming light emitting layer 205, TMI was not supplied into the reactor in growing the GaN layer.

Then, the temperature of sapphire substrate 201 was increased to 950° C. and hydrogen was supplied as a carrier gas, ammonia, TMG and TMA (trimethylaluminum) were supplied as source material gases and CP2Mg (cyclopentadienyl magnesium) was supplied as an impurity gas into the reactor to grow p-type AlGaN cladding layer 206 of $Al_{0.15}Ga_{0.85}N$ doped with Mg with a density of $1\times10^{20}/cm^3$ by the MOCVD to a thickness of approximately 30 nm on light emitting layer 205.

Then, the temperature of sapphire substrate 201 was kept at 950° C. and hydrogen was supplied as a carrier gas, ammonia and TMG were supplied as source material gases and CP2Mg was supplied as an impurity gas into the reactor to grow p-type GaN contact layer 207 of GaN doped with Mg with a density of $1\times10^{20}/cm^3$ by the MOCVD on p-type AlGaN cladding layer 206 to a thickness of 0.1 µm.

Then, the temperature of sapphire substrate 201 was decreased to 700° C. and nitrogen was supplied as a carrier gas, ammonia, TMA, TMG and TMI were supplied as source material gases and CP2Mg was supplied as an impurity gas into the reactor to grow p-type tunnel junction layer 208 of $Al_xIn_yGa_{1-(x+y)}N$ ($0 \leq x \leq 0.05$, y=0.25) doped with Mg with a density of $1\times10^{20}/cm^3$ by the MOCVD on p-type GaN contact layer 207 to a thickness of 20 nm.

Then, the temperature of sapphire substrate 201 was kept at 700° C. and nitrogen was supplied as a carrier gas, ammonia, TMA, TMG and TMI were supplied as source material gases and silane was supplied as an impurity gas into the reactor to grow n-type tunnel junction layer 209 (carrier density: $5\times10^{19}/cm^3$) of $Al_xIn_yGa_{1-(x+y)}N$ ($0 \leq x \leq 0.05$, y=0.25) doped with Si by the MOCVD on p-type tunnel junction layer 208 to a thickness of 4 nm. In n-type tunnel junction layer 209, the content of Al was identical to that of p-type tunnel junction layer 208.

As apparently seen, in the case where p-type tunnel junction layer 208 and n-type tunnel junction layer 209 did not contain Al (namely x=0), TMA was not supplied.

After this, the temperature of sapphire substrate 201 was kept at 700° C. and nitrogen was supplied as a carrier gas, ammonia and TMG were supplied as source material gases and silane was supplied as an impurity gas into the reactor to grow n-type GaN vaporization reduction layer 210 (carrier density: $5\times10^{19}/cm^3$) of GaN doped with Si on n-type tunnel junction layer 209 to a thickness of 15 nm.

After this, the temperature of sapphire substrate 201 was increased to 950° C. and hydrogen was supplied as a carrier gas, ammonia and TMG were supplied as source material gases and silane was supplied as an impurity gas into the reactor to grow n-type GaN layer 211 of GaN doped with Si with a density of $1\times10^{19}/cm^3$ on n-type GaN vaporization reduction layer 210 to a thickness of 0.2 µm.

Then, the temperature of sapphire substrate 201 was decreased to 700° C. and nitrogen was supplied as a carrier gas into the reactor to perform annealing.

The wafer after the annealing was removed from the reactor and, on the surface of the uppermost layer of the wafer, namely n-type GaN layer 211, a mask patterned in a predetermined shape was formed. By the RIE (Reactive Ion Etching), a part of the wafer was etched from the side of n-type GaN layer 211 to expose a part of the surface of n-type GaN contact layer 204.

Then, on the surface of n-type GaN layer 211, pad electrode 212 was formed and, on n-type GaN contact layer 204, pad electrode 213 was formed. Here, pad electrode 212 and pad electrode 213 were simultaneously formed by successively depositing a Ti layer and an Al layer on respective surfaces of n-type GaN layer 211 and n-type GaN contact layer 204. After this, the wafer was divided into a plurality of chips to produce the nitride semiconductor light emitting diode device in Example 4 having the structure shown in the schematic cross-sectional view of FIG. 9.

Figure 10:
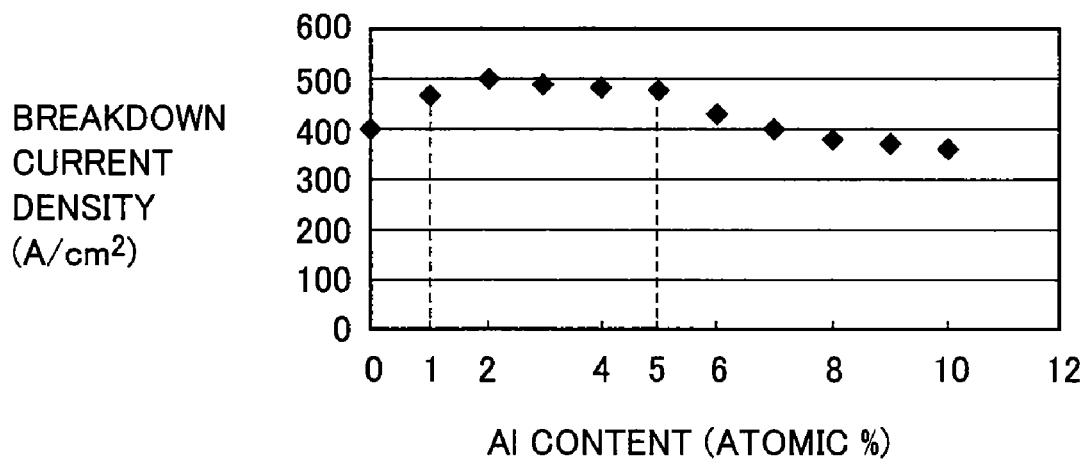
FIG. 10 shows a relation between an Al content of a p-type tunnel junction layer and an n-type tunnel junction layer and a breakdown current density of the nitride semiconductor light emitting diode device in Example 4.

FIG. 10 shows a relation between an Al content of p-type tunnel junction layer 208 and n-type tunnel junction layer 209 and a breakdown current density of the nitride semiconductor light emitting diode device in Example 1. The breakdown current density refers to the density of injected curent when the tunnel junction is broken to stop light emission. In FIG. 10, the vertical axis indicates a breakdown current density (A/cm$^2$) and the horizontal axis indicates an Al content (atomic %) of p-type tunnel junction layer 208 and n-type tunnel junction layer 209.

As shown in FIG. 10, in the case where the Al content of p-type tunnel junction layer 208 and n-type tunnel junction layer 209 is in the range of not less than 1 atomic % and not more than 5 atomic %, the breakdown current density is dramatically increased as compared with the case where the Al content is out of the range of not less than 1 atomic % and not more than 5 atomic %.

Figure 11:
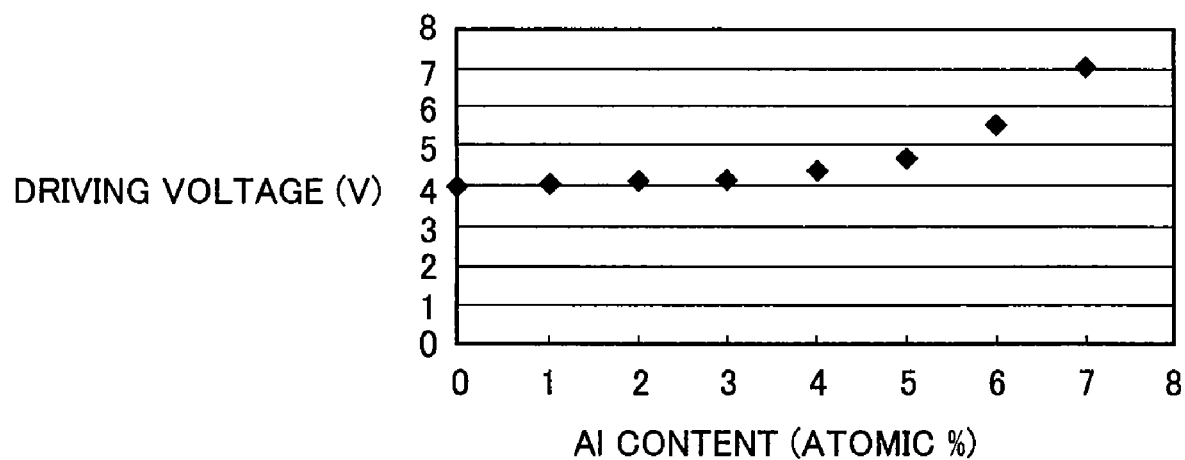
FIG. 11 shows a relation between an Al content of the p-type tunnel junction layer and the n-type tunnel junction layer and a driving voltage of the nitride semiconductor light emitting diode device in Example 4.

FIG. 11 shows a relation between an Al content of p-type tunnel junction layer 208 and n-type tunnel junction layer 209 and a driving voltage of the nitride semiconductor light emitting diode device in Example 4. In FIG. 11, the vertical axis indicates a driving voltage (V) when current of 20 mA is injected and the horizontal axis indicates an Al content (atomic %) of p-type tunnel junction layer 208 and n-type tunnel junction layer 209.

As shown in FIG. 11, from the point where the Al content of p-type tunnel junction layer 208 and n-type tunnel junction layer 209 exceeds 5 atomic %, the driving voltage sharply increases. Thus, preferably, the Al content of p-type tunnel junction layer 208 and n-type tunnel junction layer 209 is 5 atomic % or less.

Therefore, from the results above, preferably the Al content of p-type tunnel junction layer 208 and n-type tunnel junction layer 209 is 1 atomic % or more and 5 atomic % or less.

EXAMPLE 5

A nitride semiconductor light emitting diode device was fabricated under the same conditions and by the same method as those of Example 4 to the step of growing p-type GaN contact layer 207.

After p-type GaN contact layer 207 was grown, the temperature of sapphire substrate 201 was decreased to 700° C., and nitrogen was supplied as a carrier gas, ammonia, TMA, TMG and TMI were supplied as source material gases and CP2Mg was supplied as an impurity gas into the reactor to grow p-type tunnel junction layer 208 of $Al_{0.02}In_{0.25}Ga_{0.73}N$ doped with Mg with a density of $1\times10^{20}/cm^3$ by the MOCVD on p-type GaN contact layer 207 to a thickness of 20 nm.

After this, the temperature of sapphire substrate 201 was kept at 700° C., and nitrogen was supplied as a carrier gas, ammonia, TMG and TMI were supplied as source material gases and silane was supplied as an impurity gas into the reactor to grow n-type InGaN tunnel junction layer 209 (carrier density: $5\times10^{19}/cm^3$) of $In_{0.25}Ga_{0.75}N$ doped with Si by the MOCVD on p-type tunnel junction layer 208 to a thickness of 4 nm.

After this, under the same conditions and by the same method as those of Example 4, the nitride semiconductor light emitting diode device in Example 5 was fabricated.

The breakdown current density of the nitride semiconductor light emitting diode device in Example 5 was evaluated. It was found that this breakdown current density was higher than that of the nitride semiconductor light emitting diode device in Comparative Example 2 described hereinlater and thus the reliability was high.

EXAMPLE 6

A nitride semiconductor light emitting diode device was fabricated under the same conditions and by the same method as those of Example 4 to the step of growing p-type GaN contact layer 207.

After p-type GaN contact layer 207 was grown, the temperature of sapphire substrate 201 was decreased to 700° C., and nitrogen was supplied as a carrier gas, ammonia, TMG and TMI were supplied as source material gases and CP2Mg was supplied as an impurity gas into the reactor to grow p-type tunnel junction layer 208 of $In_{0.25}Ga_{0.75}N$ doped with Mg with a density of $1\times10^{20}/cm^3$ by the MOCVD on p-type GaN contact layer 207 to a thickness of 20 nm.

After this, the temperature of sapphire substrate 201 was kept at 700° C., and nitrogen was supplied as a carrier gas, ammonia, TMA, TMG and TMI were supplied as source material gases and silane was supplied as an impurity as into the reactor to grow n-type InGaN tunnel junction layer 209 (carrier density: $5\times10^{19}/cm^3$) of $Al_{0.02}In_{0.25}Ga_{0.73}N$ doped with Si by the MOCVD on p-type tunnel junction layer 208 to a thickness of 4 nm.

After this, under the same conditions and by the same method as those of Example 4, the nitride semiconductor light emitting diode device in Example 6 was fabricated.

The breakdown current density of the nitride semiconductor light emitting diode device in Example 6 was evaluated. The breakdown current density was higher than that of a nitride semiconductor light emitting diode device in Comparative Example 2 described hereinlater, and thus the reliability was high.

COMPARATIVE EXAMPLE 2

Under the same conditions and the same method as those of Example 4, the nitride semiconductor light emitting diode device was fabricated to the step of growing p-type GaN contact layer 207.

After p-type GaN contact layer 207 was grown, the temperature of sapphire substrate 201 was decreased to 700° C., and nitrogen was supplied as a carrier gas, ammonia, TMG and TMI were supplied as source material gases and CP2Mg was supplied as an impurity gas into the reactor to grow p-type tunnel junction layer 208 of $In_{0.25}GA_{0.75}N$ doped with Mg with a density of $1\times10^{20}/cm^3$ by the MOCVD on p-type GaN contact layer 207 to a thickness of 20 nm.

After this, the temperature of sapphire substrate 201 was kept at 700° C., and nitrogen was supplied as a carrier gas, ammonia, TMG and TMI were supplied as source material gases and silane was supplied as an impurity gas into the reactor to grow n-type InGaN tunnel junction layer 209 (carrier density: $5\times10^{19}/cm^3$) of $In_{0.25}Ga_{0.75}N$ doped with Si by the MOCVD on p-type tunnel junction layer 208 to a thickness of 4 nm.

After this, the nitride semiconductor light emitting diode device in Comparative Example 2 was fabricated under the same conditions and by the method as those of Example 4.

The breakdown current density of the nitride semiconductor light emitting diode device in Comparative Example 2 was lower than respective breakdown current densities of the nitride semiconductor light emitting diode devices in Examples 5 and 6, and thus the reliability was low.

In accordance with the present invention, the driving voltage can be reduced of a nitride semiconductor light emitting device such as nitride semiconductor light emitting diode device having a tunnel junction and emitting blue light (wavelength: 430 nm or more and 490 nm or less for example).

In accordance with the present invention, the reliability can be improved of a nitride semiconductor light emitting device such as nitride semiconductor light emitting diode device having a tunnel junction and emitting blue light (wavelength: 430 nm or more and 490 nm or less for example).

Although the present invention has been described and illustrated in detail, it is clearly understood that the same is by way of illustration and example only and is not to be taken by way of limitation, the scope of the present invention being interpreted by the terms of the appended claims.

What is claimed is:

1. A nitride semiconductor light emitting device comprising:
   a substrate;
   a first n-type nitride semiconductor layer formed on said substrate;
   a light emitting layer formed on said first n-type nitride semiconductor layer;
   a first p-type nitride semiconductor layer formed on said light emitting layer;
   a second p-type nitride semiconductor layer formed on said first p-type nitride semiconductor layer;

a p-type nitride semiconductor tunnel junction layer formed on said second p-type nitride semiconductor layer, the p-type nitride semiconductor tunnel junction layer comprising p-type nitride semiconductor material including indium;

an n-type nitride semiconductor tunnel junction layer formed on said p-type nitride semiconductor tunnel junction layer;

a second n-type nitride semiconductor layer formed on said n-type nitride semiconductor tunnel junction layer, the second p-type nitride semiconductor layer comprising p-type nitride semiconductor material including indium; and wherein said p-type nitride semiconductor tunnel junction layer and said n-type nitride semiconductor tunnel junction layer form a tunnel junction, and said p-type nitride semiconductor tunnel junction layer has an indium content ratio higher than an indium content ratio of said second p-type nitride semiconductor layer.

2. The nitride semiconductor light emitting device according to claim 1, wherein
said second p-type nitride semiconductor layer has a thickness of not less than 2 nm.

3. The nitride semiconductor light emitting device according to claim 1, wherein
said second p-type nitride semiconductor layer has its thickness of not less than a critical thickness.

4. The nitride semiconductor light emitting device according to claim 1, wherein
said second p-type nitride semiconductor layer is doped with a p-type impurity with a doping density of not less than $1\times10^{19}/cm^3$.

5. The nitride semiconductor light emitting device according to claim 1, wherein
said p-type nitride semiconductor tunnel junction layer has a thickness of not more than 5 nm.

6. The nitride semiconductor light emitting device according to claim 1, wherein
said p-type nitride semiconductor tunnel junction layer is doped with a p-type impurity with a doping density of not less than $1\times10^{19}/cm^3$.

7. The nitride semiconductor light emitting device according to claim 1, wherein
said first p-type nitride semiconductor layer has its band gap larger than that of said second p-type nitride semiconductor layer, and said second p-type nitride semiconductor layer has its band gap larger than that of said p-type nitride semiconductor tunnel junction layer.

8. The nitride semiconductor light emitting device according to claim 1, wherein
said n-type nitride semiconductor tunnel junction layer includes indium.

9. The nitride semiconductor light emitting device according to claim 1, wherein
said n-type nitride semiconductor tunnel junction layer is doped with an n-type impurity with a doping density of not less than $1\times10^{19}/cm^3$.

10. The nitride semiconductor light emitting device according to claim 1, wherein
said n-type nitride semiconductor tunnel junction layer has a thickness of not more than 10 nm.

11. A nitride semiconductor light emitting device comprising:
a substrate;
a first n-type nitride semiconductor layer formed on said substrate;
a light emitting layer formed on said first n-type nitride semiconductor layer;
a p-type nitride semiconductor layer formed on said light emitting layer;
a p-type nitride semiconductor tunnel junction layer formed on said p-type nitride semiconductor layer;
an n-type nitride semiconductor tunnel junction layer formed on said p-type nitride semiconductor tunnel junction layer; and
a second n-type nitride semiconductor layer formed on said n-type nitride semiconductor tunnel junction layer;
wherein said p-type nitride semiconductor tunnel junction layer and said n-type nitride semiconductor tunnel junction layer form a tunnel junction, and at least one of said p-type nitride semiconductor tunnel junction layer and said n-type nitride semiconductor tunnel junction layer includes aluminum;
an aluminum content of at least one of said p-type nitride semiconductor tunnel junction layer and said n-type nitride semiconductor tunnel junction layer is not less than 1 atomic % and not more than 5 atomic %; and
said p-type nitride semiconductor tunnel junction layer includes aluminum and indium, and indium content is higher than aluminum content.

12. The nitride semiconductor light emitting device according to claim 11, wherein
said p-type nitride semiconductor tunnel junction layer is doped with a p-type impurity with a doping density of not less than $1\times10^{19}/cm^3$.

13. The nitride semiconductor light emitting device according to claim 11, wherein
said n-type nitride semiconductor tunnel junction layer is doped with an n-type impurity with a doping density of not less than $1\times10^{19}/cm^3$.

14. The nitride semiconductor light emitting device according to claim 11, wherein
said n-type nitride semiconductor tunnel junction layer has a thickness of not more than 10 nm.

15. A nitride semiconductor light emitting device comprising:
a substrate;
a first n-type nitride semiconductor layer formed on said substrate;
a light emitting layer formed on said first n-type nitride semiconductor layer;
a p-type nitride semiconductor layer formed on said light emitting layer;
a p-type nitride semiconductor tunnel junction layer formed on said p-type nitride semiconductor layer;
an n-type nitride semiconductor tunnel junction layer formed on said p-type nitride semiconductor tunnel junction layer; and
a second n-type nitride semiconductor layer formed on said n-type nitride semiconductor tunnel junction layer;
wherein said p-type nitride semiconductor tunnel junction layer and said n-type nitride semiconductor tunnel junction layer form a tunnel junction;
at least one of said p-type nitride semiconductor tunnel junction layer and said n-type nitride semiconductor tunnel junction layer includes aluminum;
an aluminum content of at least one of said p-type nitride semiconductor tunnel junction layer and said n-type nitride semiconductor tunnel junction layer is not less than 1 atomic % and not more than 5 atomic %; and said n-type nitride semiconductor tunnel junction layer includes aluminum and indium, and indium content is higher than aluminum content.

16. The nitride semiconductor light emitting device according to claim 15, wherein said p-type nitride semiconductor tunnel junction layer is doped with a p-type impurity with a doping density of not less than $1 \times 10^{19}/cm^3$.

17. The nitride semiconductor light emitting device according to claim 15, wherein said n-type nitride semiconductor tunnel junction layer is doped with an n-type impurity with a doping density of not less than $1 \times 10^{19}/cm^3$.

18. The nitride semiconductor light emitting device according to claim 15, wherein said n-type nitride semiconductor tunnel junction layer has a thickness of not more than 10 nm.

* * * * *